(12) United States Patent
Kirkman (10) Patent No.: US 6,369,648 B1
(45) Date of Patent: *Apr. 9, 2002

(54) LINEAR TRAVELING WAVE TUBE AMPLIFIER UTILIZING INPUT DRIVE LIMITER FOR OPTIMIZATION

(75) Inventor: George F. Kirkman, Palos Verdes, CA (US)

(73) Assignee: Hughes Electronics Corporation, El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/295,720

(22) Filed: Apr. 21, 1999

(51) Int. Cl.[7] ................................................ H03F 3/58
(52) U.S. Cl. ........................................ 330/43; 330/140
(58) Field of Search ......................... 330/43, 140, 141, 330/281, 284, 149

(56) References Cited

U.S. PATENT DOCUMENTS

| | | | |
|---|---|---|---|
| 4,066,965 A | | 1/1978 | Schultz et al. ............... 325/120 |
| 4,220,929 A | * | 9/1980 | Talbot et al. ................ 330/136 |
| 4,398,157 A | | 8/1983 | Dietrich et al. ............... 330/86 |
| 4,691,173 A | | 9/1987 | Mollett, et al. .............. 330/144 |
| 5,177,453 A | * | 1/1993 | Russell et al. ............... 330/284 |
| 5,631,968 A | | 5/1997 | Frey et al. ................... 381/106 |
| 5,789,978 A | * | 8/1998 | Zhang et al. ................. 330/149 |
| 5,622,939 A | | 5/1999 | Kitani, et al. ................ 381/106 |
| 5,999,047 A | * | 12/1999 | Zhang et al. ................. 330/149 |

* cited by examiner

Primary Examiner—Robert Pascal
Assistant Examiner—Henry Choe
(74) Attorney, Agent, or Firm—Gates & Cooper LLP (57) ABSTRACT

A linearized traveling wave tube amplifier with average power limiter is disclosed. The device includes an average power limiter for the purpose of preventing a TWT from operating at output powers higher than the required operating point. The device includes a detector for dynamically producing a detector signal proportional to an average power of an input signal and substantially independent from a peak power of the input signal, and an attenuator, in communication with the detector and the amplifier, for dynamically attenuating the input signal according to the detector signal. The limiter allows the TWTs to be optimized for performance at the required operating point, resulting in higher efficiency, and eliminates the need to size the amplifier for a power level any larger than the required operating point which reduces the cost and complexity of the system. The limiter protects the TWT while not degrading the linear performance of the TWT by limiting the average power while allowing peak powers of short duration to pass with low loss.

33 Claims, 11 Drawing Sheets

LINEAR TRAVELING WAVE TUBE AMPLIFIER UTILIZING INPUT DRIVE LIMITER FOR OPTIMIZATION

BACKGROUND OF THE INVENTION

1. Field of the Invention

The present invention relates to systems and methods of amplifying signals and in particular to a system and method for limiting the average power output of a traveling wave tube amplifier without limiting peak power output.

2. Description of the Related Art

Combining a linearizer with a traveling wave tube amplifier (TWT) allows for more efficient operation of the power amplifier while maintaining linear performance. To fully exploit this advantage it is desirable to optimize the TWT for best efficiency at the operating point. For most TWT designs, optimizing for efficiency at a backed off operating point results in a condition where increasing drive levels above the operating point can be damaging to the TWT due to collector backstreaming and beam defocusing problems. Designing the TWT to handle the higher drive levels also results in increased cost and design complexity.

One possible way of protecting the TWT is to incorporate an input drive limiter into the linearizer. Unfortunately, limiting the drive level is not compatible with linear performance of the system. To provide linear performance under multicarrier operation, an amplifier must have an amplitude modulation-to-amplitude modulation (AM—AM) transfer characteristic that is linear for a range of drive levels above and below the operating point. This requirement is due to the way that the multiple carriers sum together resulting in high peak powers. For example, for two equal carriers, the peak power is 6 dB above the average individual carriers. For multiple carriers, the peak value can be much higher, that is, approximately 8.4 dB for 8 carriers randomly phased. Any limiter would have to be set at a level that is 6 or more dB higher than the operating point and this would eliminate almost all advantages of optimizing the TWT at back-off.

Another way of protecting the TWT is to use limiters that limit both peak as well as average power. These are implemented using a simple saturating amplifier. Such limiters afford some protection to the TWT but in order to preserve linear performance, they must be set at a point that is far above the required operating point. This greatly limits their value in this application. This type of limiter is typically set at a saturation point of the TWT or higher and only provides protection from accidental overdrive conditions.

Although circuits for compensating the gain compression and phase of nonlinear amplifiers such as traveling wave tubes exist in the prior art, none of these circuits include a limiter that limits average power without limiting peak power as well. For example, although U.S. Pat. No. 5,304,944, issued to Copeland et al. discloses a passive limiter made up of PIN diodes, this type of limiter will not achieve the result of the present invention as it will limit peak power as well as average and therefore will degrade linearity if set near the desired operating point. U.S. Pat. No. 5,598,127, issued to Abbiati et al., discloses a procedure and circuit for adjusting the compensation of gain distortions in a microwave amplifier. The procedure is based on a circuit that monitors the ratio of peak to average power and feeds back a signal to adjust the compensation circuit before the amplifier, and in which the control circuit is adjusted such that the peak to average power ratio of the output remains constant. This control circuit provides a means for maintaining linear performance in the presence of changing amplifier linearity due to life or environmental changes, but provides no means of protection for the high power amplifier because the average power is not controlled and could increase beyond the capability of the amplifier. Also, this circuit relies on monitoring the output power of the amplifier, which adds complexity and loss to high power systems.

What is needed is a system and method that allows optimizing a linearized traveling wave tube amplifier for both linearity and efficiency at the operating point while protecting the TWT from inadvertent excursions of input drive levels. The present invention satisfies that need.

SUMMARY OF THE INVENTION

As noted above, an optimized TWT design must provide linearity, yet protect the TWT from inadvertent drive level excursions at the same time. The resolution of these apparently incompatible design goals is problem is rooted in the discovery that TWT failure modes and TWT linearity are influenced by distinctly different signal and power dynamics. The present invention advantageously uses a measure of these signal dynamics advantage to provide both TWT linearity and resistance to damage from excessive drive level.

Signal peaks encountered during multicarrier operation exist only for short periods of time and are not damaging to the TWT. The difference between peak and average power becomes more pronounced (and in a predictable manner) as the number of carriers increases. Operating the TWT under multicarrier conditions will not produce damage provided that the average power is not increased above the optimized operating point.

However, the TWT can be damaged by excessive average power levels. These excessive levels generally occur under accidental conditions in test or in operation due to changes in attenuation such as changes in atmospheric attenuation of the uplink signal.

In accordance with the foregoing, the present invention discloses system comprising an average power dependent attenuator and a TWTA, if required a predistortion linearizer can be added to further improve linearity. An attenuator that has a slow frequency response such that peak powers are passed with minimal attenuation but average powers are subject to a large attenuation is positioned before the radio frequency (RF) input of the TWTA. The result is a system that has an AM—AM transfer characteristic that is dependent on average power. For low average power the transfer curve is linear to drive levels far in excess of the required operating point. If the average power is increased to levels above the required operating point the input attenuation changes and the transfer curve shifts to a lower output power but retains its shape. In this way an average output power is maintained that drives the TWTA at the desired operating point and no higher.

The implementation of the average power limiter can be accomplished by a voltage controlled attenuator circuit which is driven by a detector circuit that produces a substantially non-alternating or direct current (DC) voltage proportional to average power.

In accordance with the foregoing, the present invention discloses a method and apparatus for limiting an average power output of an amplifier without limiting the peak power output of the amplifier.

The method comprises the steps of dynamically determining a value proportional to an average power of an amplifier input signal and substantially independent from a peak power of the amplifier input signal, dynamically attenuating the amplifier input signal according to the value, and applying the dynamically attenuated amplifier input signal to an amplifier to produce the amplifier output signal.

The apparatus comprises a detector for dynamically producing a detector signal proportional to an average power of the input signal and substantially independent from a peak power of the input signal, and an attenuator in communication with the detector and the amplifier, for dynamically attenuating the input signal according to the detector signal.

In one embodiment, the detector comprises a current rectifier such as a diode device in series with a low pass filter, which can be implemented by a simple resistive-capacitive (RC) circuit. In another embodiment, the attenuator comprises a shunt limiter such an enhancement field effect transistor (FET) with a gate coupled to the detector.

The foregoing implements an average power limiter that prevents a TWT from operating at output powers higher than the required operating point. Employing this limiter allows for the TWTs to be optimized for performance at the required operating point, resulting in higher efficiency and eliminates the need to size the amplifier for a power level any larger than the required operating point which reduces the cost and complexity of the system. The power limiter protects the TWT while not degrading the linear performance of the TWT by limiting the average power while allowing peak powers of short duration to pass with low loss. This provides an optimized traveling wave tube amplifier optimized for both linearity and efficiency at the operating point while protecting the TWT from inadvertent excursions of input drive levels. The present invention is especially applicable to high power microwave amplifier systems, specifically including systems that operate with multi-carrier signals.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

As described in the foregoing, the problem exists that in order to provide linear performance, TWTs are operated well below their maximum saturated output power capability. This results in suboptimized performance and the requirement that the TWTs be designed to survive at the higher operating powers that may exist under fault conditions. In order to fully understand the benefits of the invention a description of amplifier performance in the presence of multiple carriers is provided.

To obtain linear performance when operating with multi carrier signals an amplifier must have a power transfer curve that is linear to levels well above the required operating point. If the power transfer is not linear the peaks of the composite signal are degraded which results in intermodulation products being produced.

Figure 1:
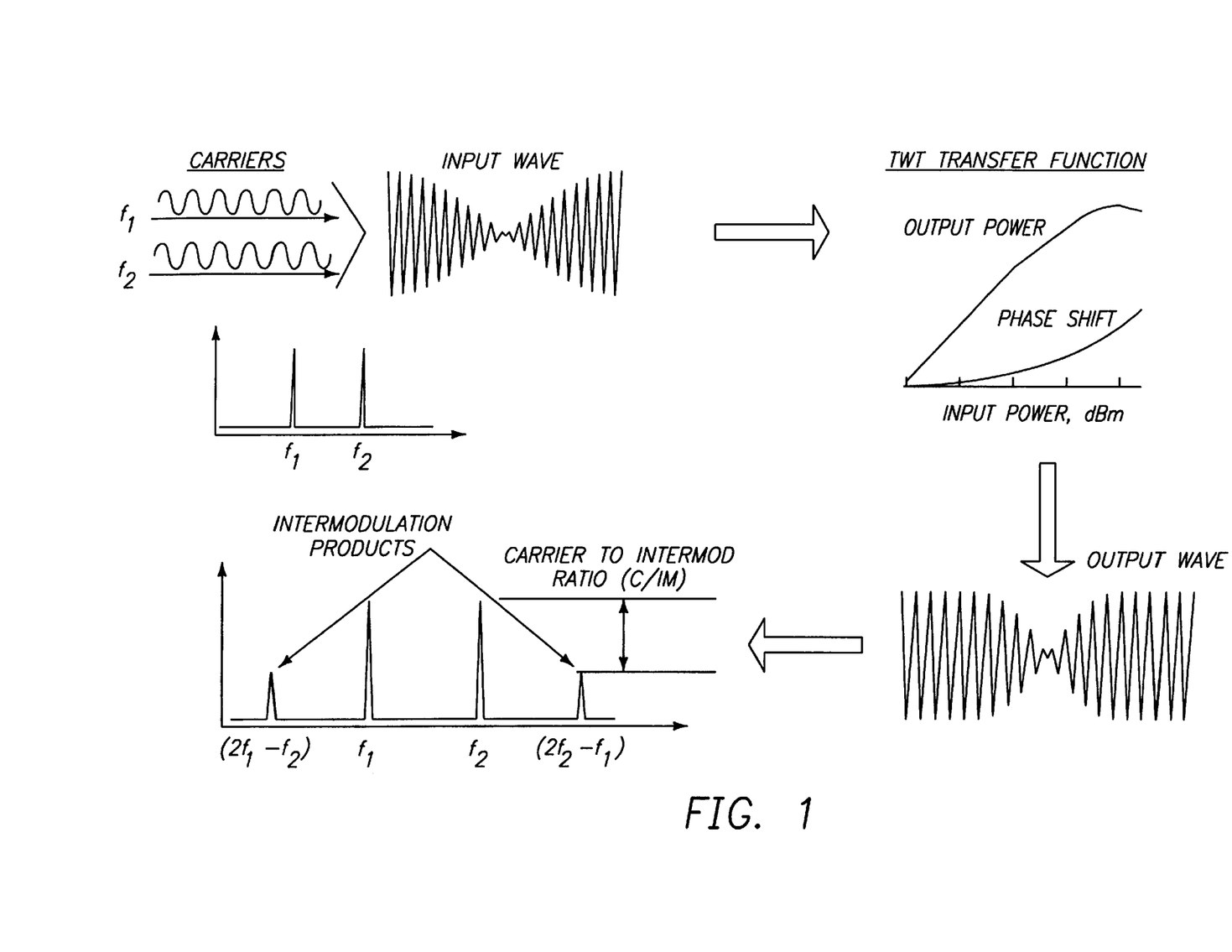
FIG. 1 is a diagram presenting in illustration of the relationship between intermodulation products and TWT transfer function linearity.

FIG. 1 depicts a time-domain and frequency domain representation of two tone (represented by carrier frequencies $f_1$ and $f_2$) multi-carrier input signal. When this signal is passed through a TWT with a transfer function that is non-linear in terms of power or phase shift, the output signal will include intermodulation products at frequencies of $(2f_1-f_2)$ and $(2f_2-f_1)$. The ratio of the amplitude of these undesirable intermodulation products is described as the carrier to intermodulation ratio, or C/IM.

Figure 2:
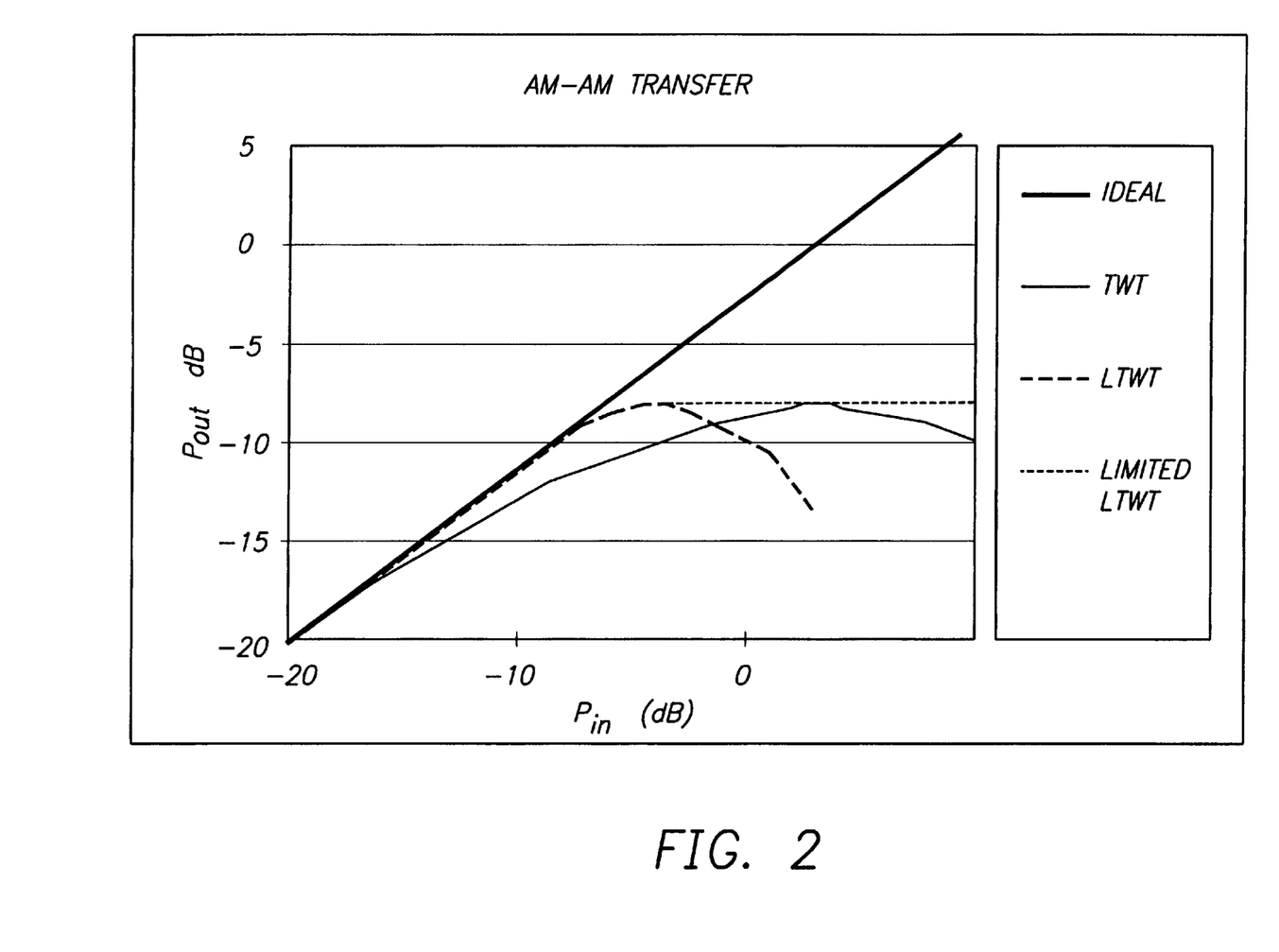
FIG. 2 is a diagram comparing the transfer function of an ideal TWT amplifier with real-world TWT amplifier characteristics.

An ideal amplifier would have a linear transfer of power with output power that increases 1 dB for each 1 dB increase in input power. In reality a TWT amplifier even when linearized shows a saturation at some power level where the increase in output power with input power is less than 1 dB per dB or even negative. Operating near or above this saturation point is not useful for linear systems due to the intermodulation distortion described above.

For these reasons, it is beneficial to limit the input power level to the TWT to a level below the saturation point. This higher TWT efficiency in the linear operating region allows for a less complex design due to the reduced power handling requirements. This could be implemented by providing a limiter at a set power level. This can be accomplished by the use of a limiter set at the saturation point of the TWT to preserve linearity to the highest possible point.

Consider the case of an input signal with a single carrier represented by the following equation:

$$A \sin(\omega t)$$

Such an input signal has a peak amplitude of A and an average amplitude proportional to $\frac{1}{2} A^2$.

Further, consider the case of an input signal with two carriers described by two equal amplitude signals at two different frequencies. This can be represented by the following equations:

$$A \sin(\omega 1\tau+\phi 1),$$

and $$A \sin(\omega 2\tau+\phi 2)$$

Each signal has a peak amplitude A and carries power calculated using Poyntings theorem proportional to ½A². The combined signal represented using trigonometric angle sum and difference relations:

$$A \sin(\omega 1\tau+\phi 1)+A \sin(\omega 2\tau+\phi 2)=2A \sin[(\omega 1+\phi 2)\tau/2+(\phi 1+\phi 2)/2]\cos[(\omega 1-\omega 2)\tau/2+(\phi 1-\phi 2)/2]$$

The combined signal therefore has a peak amplitude 2A and carries power proportional to A². To preserve linearity, an amplifier must have a linear transfer curve to peak value of 2A. A single carrier with amplitude 2A carries power proportional to 2A² or 6 dB more than each individual carrier. Therefore the limiter must be set at a level that is at least 6 dB higher than each individual carrier.

Figure 3:
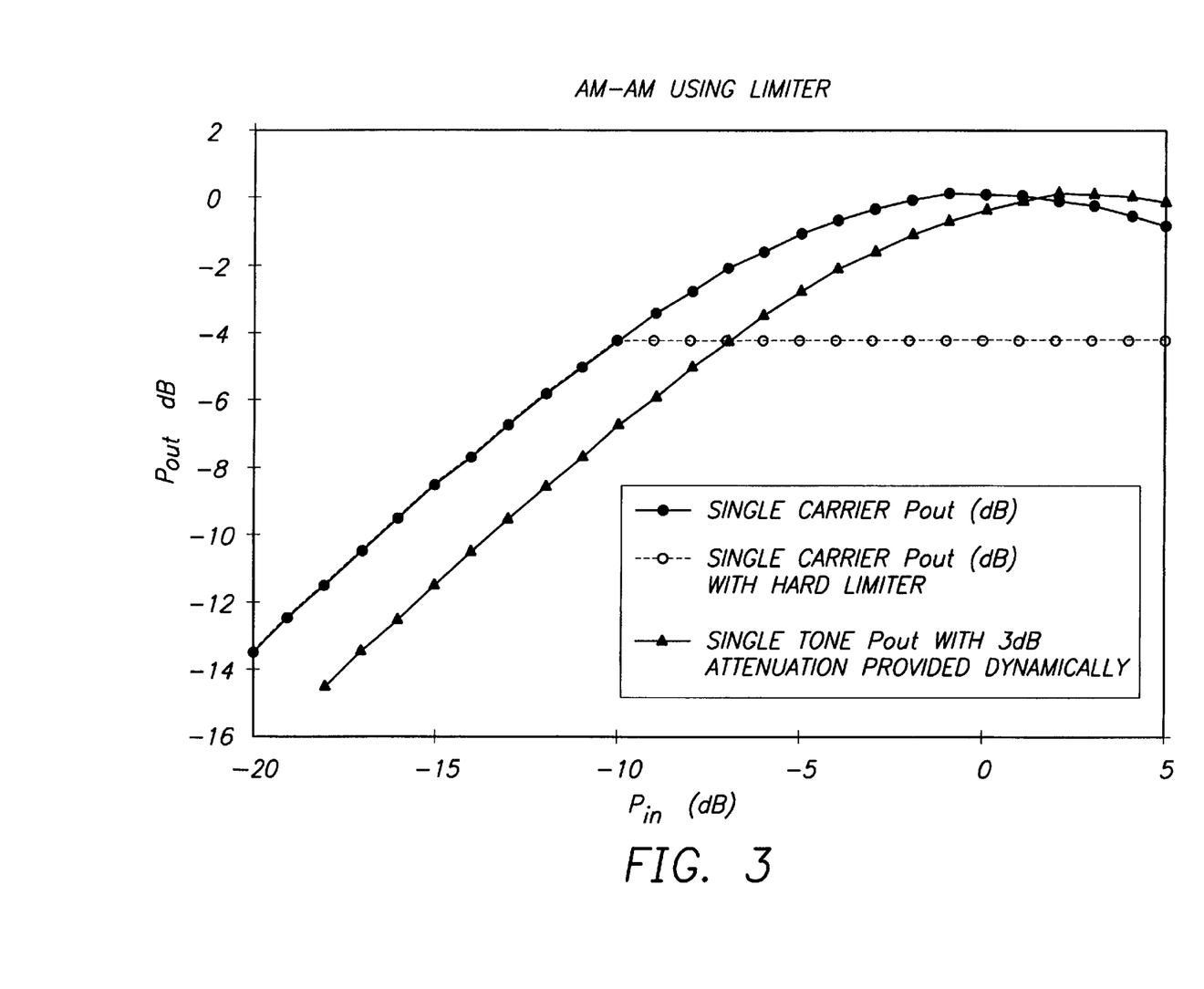
FIG. 3 is a diagram of a transfer curve used in an analysis of the relationship between the carrier and third order intermodulation product level (C/3IM)
Figure 4:
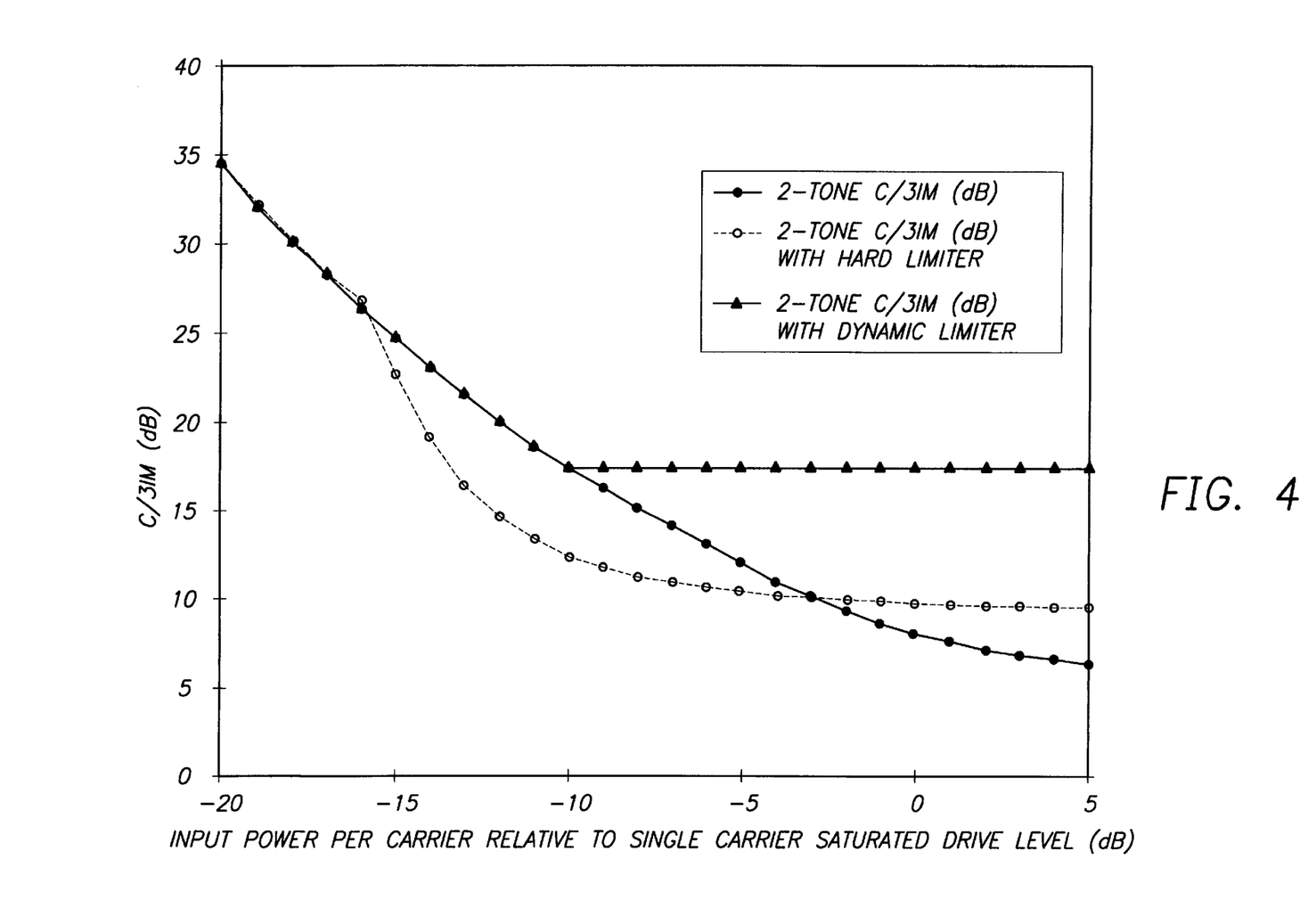
FIG. 4 is a diagram of the relationship between the carrier and third order intermodulation product level (C/3IM) for the transfer curve shown in FIG. 3.

FIGS. 3 and 4 present an analysis to determine the carrier to third order intermodulation product level (C/3IM) for a TWT transfer characteristic and a TWT with hard limiter.

FIG. 3 is a diagram presenting the amplifier transfer curves used to generate the results shown in FIG. 4. The TWT transfer curve (labeled "Single Carrier $P_{out}$(dB))" is a typical curve for an amplifier produced by the Electron Dynamics Division of HUGHES ELECTRONICS, the limited curve (labeled "Limited Single Carrier $P_{out}$(dB)" is a hypothetical perfect limiter set at a level 10 dB below the single carrier saturation point of the amplifier. The curve labeled "Dynamically Limited $P_{out}$" is produced by shifting the curve to higher input drive levels by a dynamic limiter.

FIG. 4 is a diagram showing C/3IM calculated for both the limited and non-limited cases. In the limited case, degradation of C/3IM is observed for input drive levels of −16 dB per carrier relative to the single carrier saturation point. This is 6 dB below the limiter set point, which confirms the predicted 6 dB requirement. When using the dynamically limited curve, the C/3IM remains constant at the limited power level.

Figure 5:
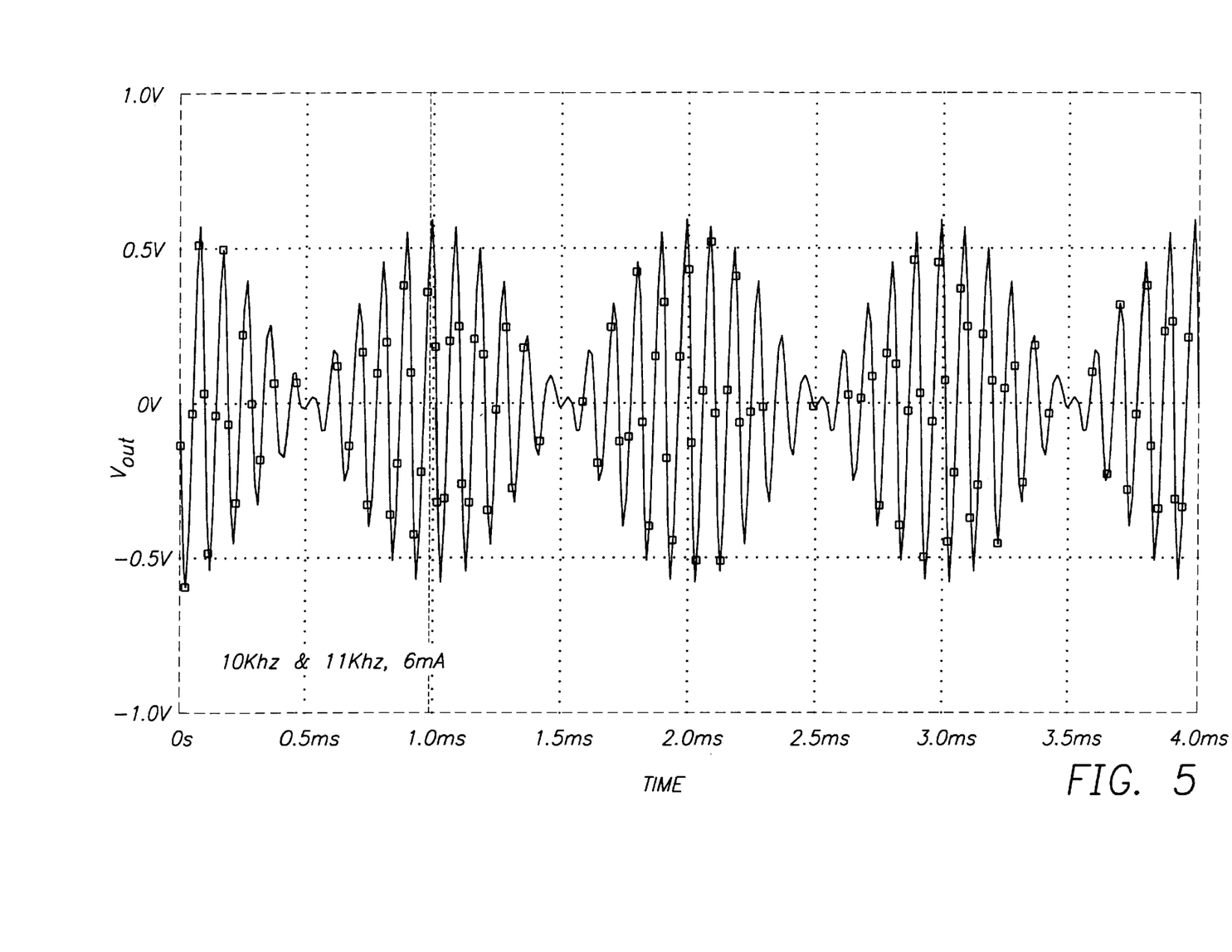
FIG. 5 is a diagram of a two-carrier composite signal.
Figure 6:
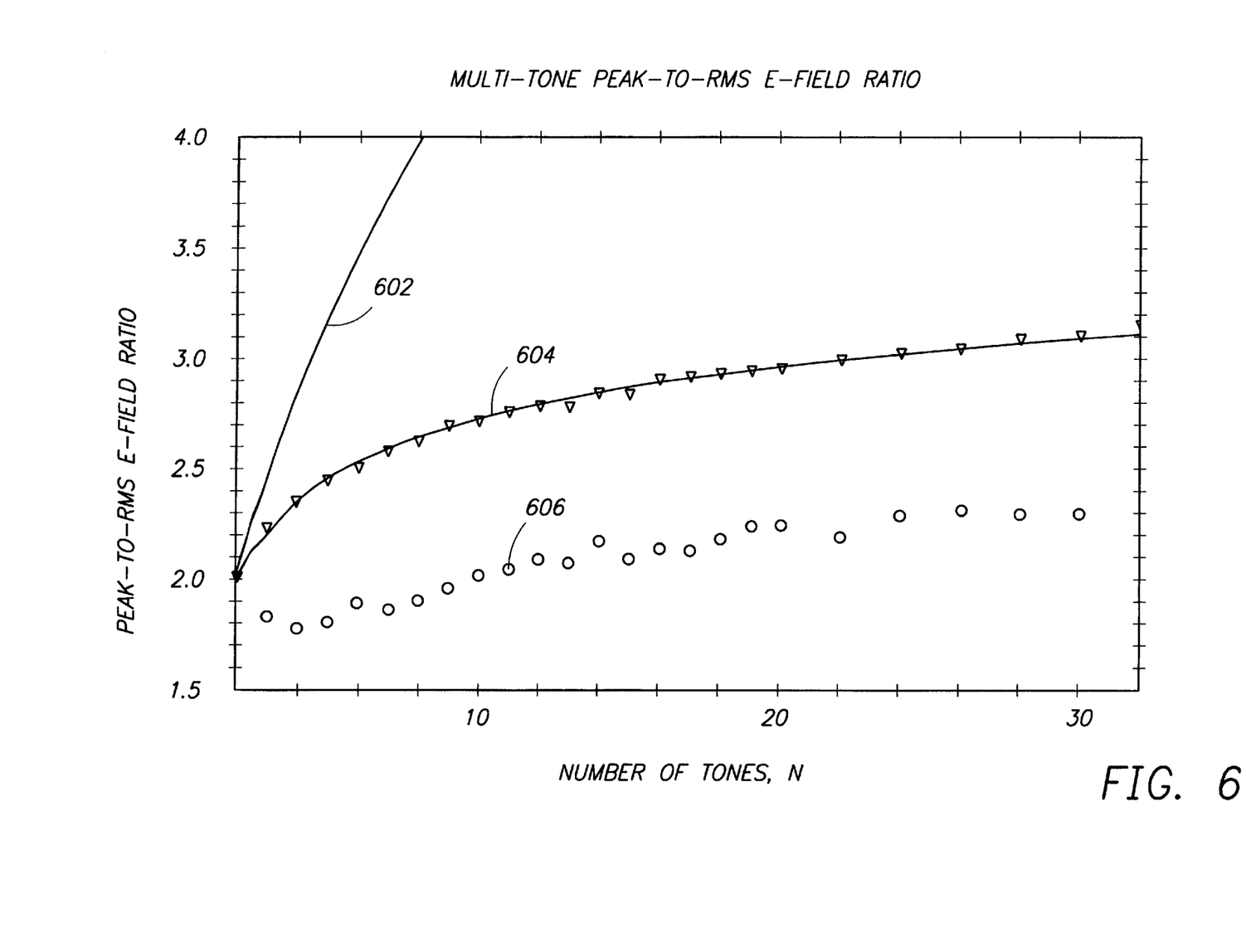
FIG. 6 is a diagram of a comparison between the peak and root mean square (RMS) electric field intensity for multi-carrier signals with different number of tones.
Figure 7:
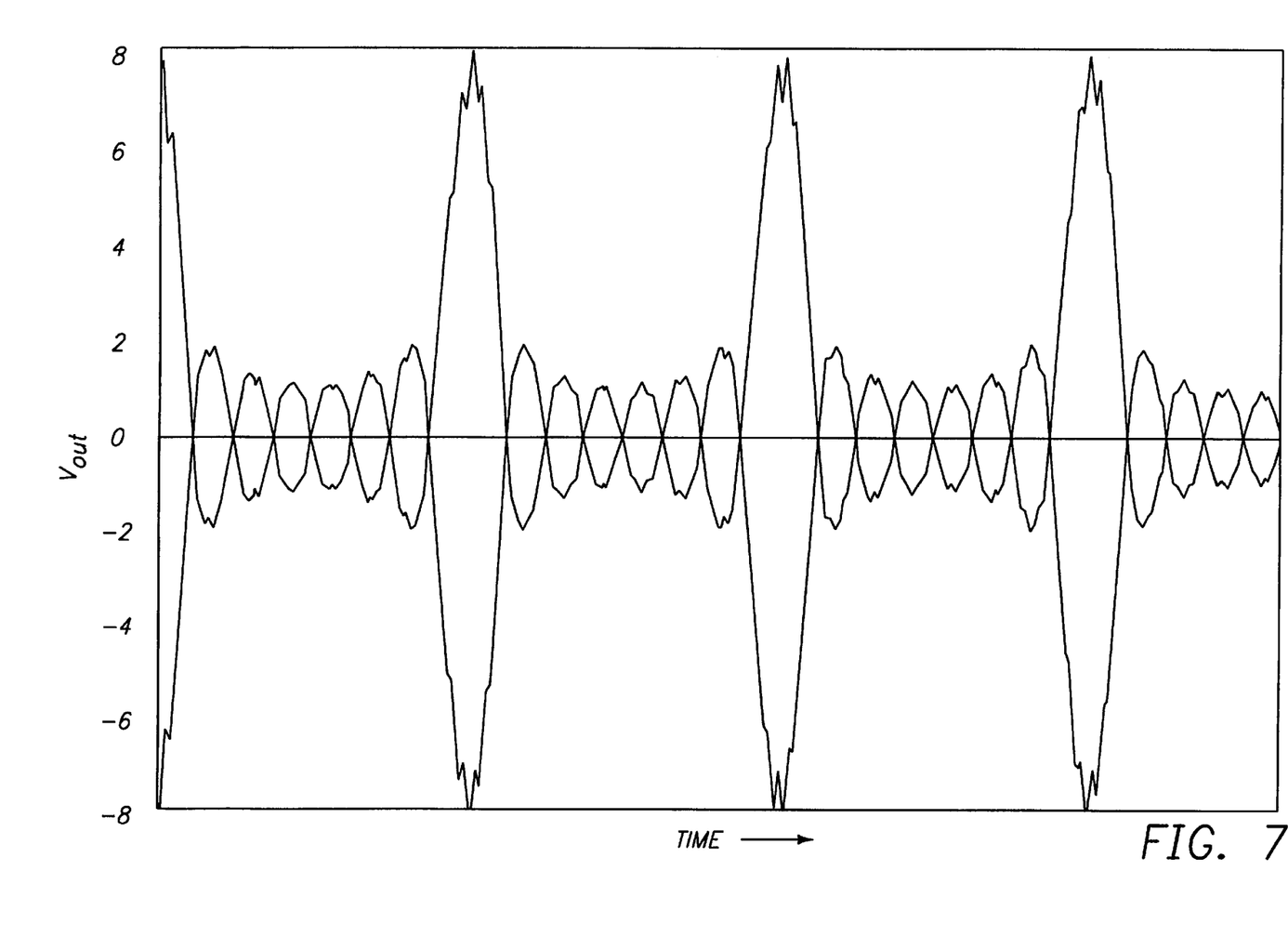
FIG. 7 is a diagram showing a graphical representation of an eight-carrier signal in time.

FIGS. 5–7 present examples of multi-carrier signals. FIG. 5 shows a two carrier composite signal with the characteristic shape of a sin wave modulated by a cosine function. This is a graphical representation of a signal similar to that used in the analysis presented in FIG. 4. The waveform presented in FIG. 5 shows that the peaks of the signal are significantly higher than it average value.

FIG. 6 is a diagram showing a comparison of peak to RMS electric field for multicarrier signals with different numbers of tones. The peak-to-RMS ratio for two carriers is two, and the power ratio is 20·Log($E_{peak}/E_{RMS}$) or 6 dB. The ratio is larger as the number of carriers increases. Plots 602 shows the peak-to-RMS electric field for a coherently phased (worst) case in which the peak-to-RMS E-field ratio is $\sqrt{2N}$. Plot 604 shows the peak-to-RMS electric field for a randomly phased case. This results can be curve fitted to a line described by 1.74 ln(ln(11.6·N)). Plot 606 shows the phase nulled (best) case.

FIG. 7 shows a graphical representation of an eight-carrier signal in time. The high peaks for short periods of time are readily observed as is the comparatively low average level of the signal.

Input Drive Limiter Operation

Average power is what drives the TWT design. Typically, the thermal time constant for damage to the TWT by high average power is on the order of milliseconds. Typically, because of the TWT thermal time constant, excessive average power for a period of time in the order of milliseconds is sufficient to do permanent TWT damage. At the same time, signal peaks (and hence peak power) must pass without distortion. Such signal peaks are typically present for times based on the microwave signal being amplified and are typically on the order of nanoseconds or less. This large separation in time constants gives rise to the possibility of a circuit that can protect the TWT with a slow response while not degrading the waveform on short time scales.

Figure 8:
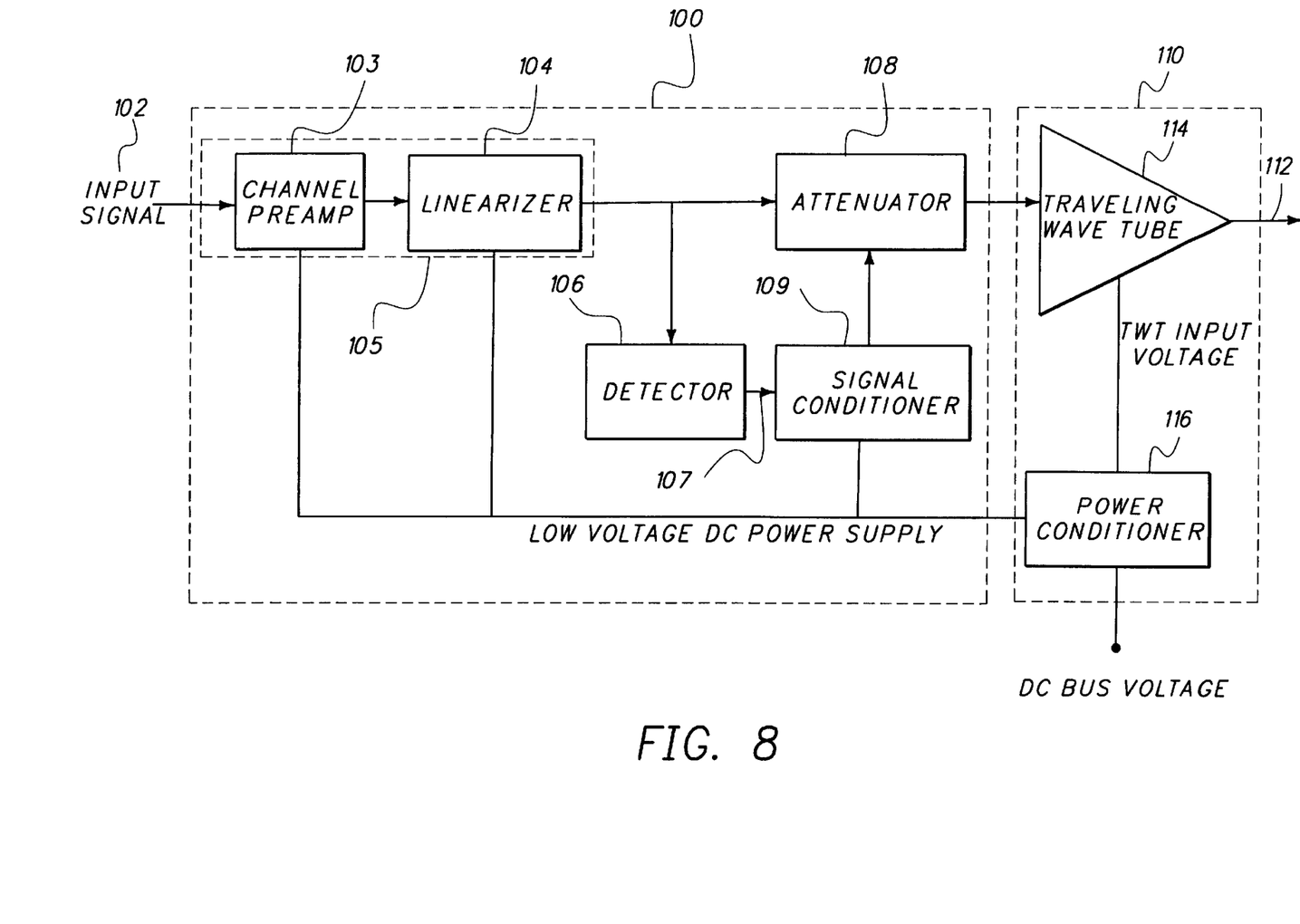
FIG. 8 is a block diagram showing a top-level representation of a linear traveling wave tube amplifier using an input drive limiter.

FIG. 8 is a diagram presenting a block diagram of an input drive limiter 100 implementing such a circuit. The input drive limiter 100 comprises a detector 106 and an attenuator 108, which are in communication with a radio frequency (RF) input signal 102. The input signal 102 may optionally be conditioned by a signal preconditioner 105 comprising a channel preamplifier 103 in communication with a predistortion linearizer 104 to increase the linearity of the output signal 112 obtained from the amplifier 110 in the non-saturation region. The detector 106 dynamically produces a detector signal 107 from the input signal 102 that is proportional to the average power of the input signal 102 and substantially independent from the peak power of the input signal 102. The detector provides the detector signal 107 to the attenuator 108. Optionally, the detector signal 107 is provided to the attenuator 108 via a signal conditioner 109 for purposes described herein.

The amplifier 110 provides an output signal 112 at RF frequencies, and comprises a traveling wave tube 114 and a power conditioner 116. The power conditioner 116 supplies a high voltage input to the traveling wave tube 114 and provides supply voltage to other components.

Generally, the ideal relationship between the input signal 102 and the detector signal 107 is that of linear proportionality. That is, the detector signal 107 is linearly proportional to the input signal 102. However, it should be noted that although the proportionality between the average power of the input signal 102 and the detector signal 107 is ideally linear, linear proportionality between the input signal 102 and the detector signal 107 is not required to practice the present invention. For example, in accordance with the description of the attenuator 108 that follows, as a matter of design choice, non-linear proportionality between the input signal 102 and the detector signal 108 can be accounted for by suitable design of the attenuator 108 to account for any such non-linearities.

Figure 9:
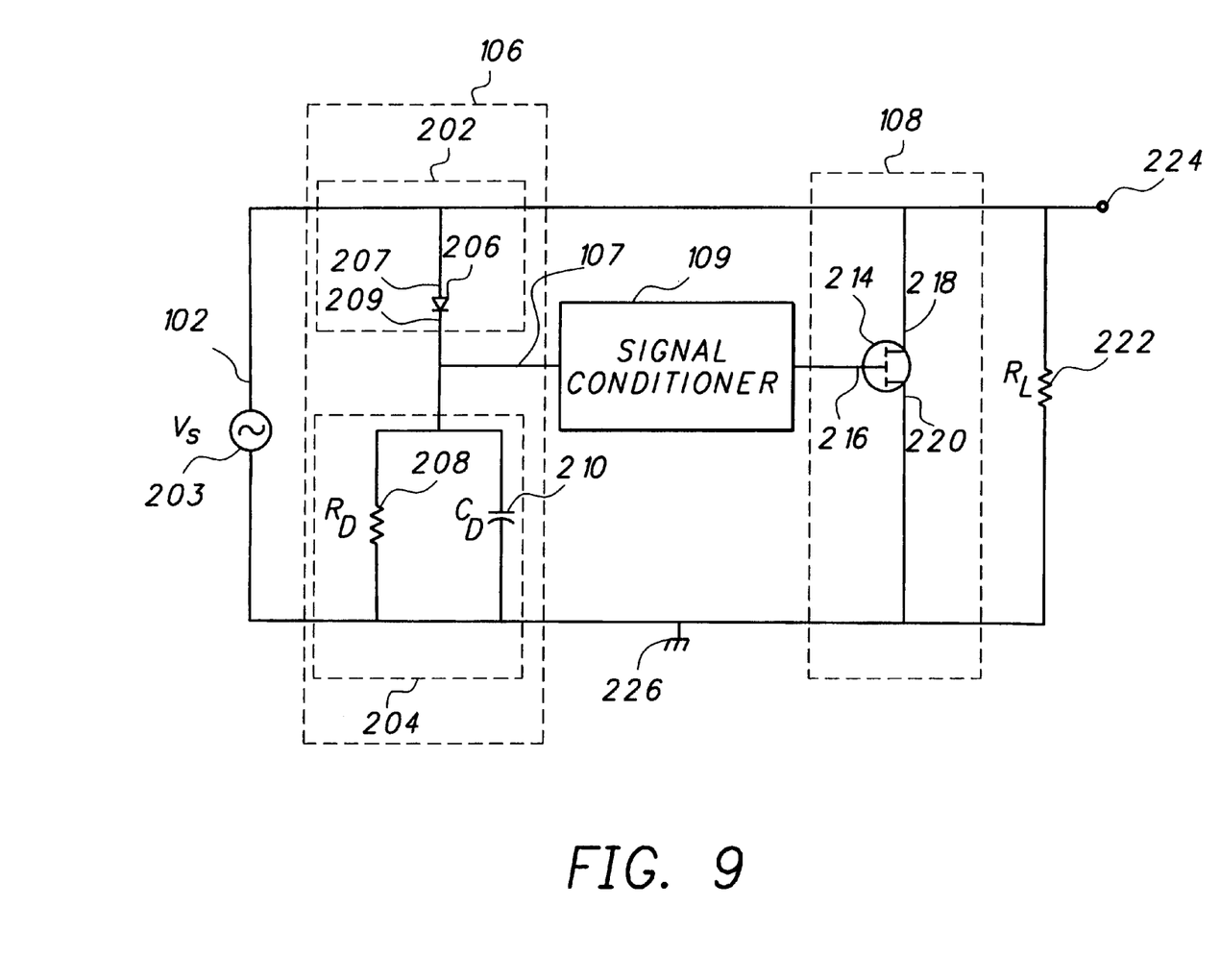
FIG. 9 is a schematic diagram showing an embodiment of the input drive limiter.

FIG. 9 presents one embodiment of the input drive limiter 100. As depicted in this embodiment, the detector 106 comprises a current rectifier 202 and a low pass filter 204. In the illustrated embodiment, the current rectifier 202 includes a diode 206 having an anode 207 in communication with the input signal 102 provided by an input signal source 203 and a cathode 209 coupled to the low pass filter 204. The current rectifier 202 converts the alternating current (AC) input signal 102 into a half-wave rectified (positive for all values of time) signal. When this signal is low-pass filtered by the low pass filter 204, a detector signal 107 proportional to the average power of the input signal 102 is produced. It should be noted that the current rectifier 202 could be replaced by other circuit elements with similar function. For example, a two-way or four-way bridge using four diodes can be implemented to produce a full-wave rectified signal, if desired.

The low pass filter 204 comprises a resistive element 208 such as low pass filter resistor and a capacitive element 210 such as low pass filter capacitor, coupled in parallel. So coupled, the low pass filter 204 implements a circuit wherein the detector signal 207 lags the rectified signal from the diode 206 according to a first order time constant relationship of 1/RC.

In some circumstances, low pass filter 204 networks with multiple-order time constants may be preferred. This selection will depend on the time duration relationship between the average power changes and peak power pulses in the input signal 102. Thus, a matter of design choice, the low pass filter can be designed to exhibit a steeper filtering of input signals.

In one embodiment, the detector signal 107 is communicated directly to the attenuator 108, which dynamically attenuates the input signal according to the detector signal. In another embodiment, the detector signal 107 is passed through a signal conditioner 212, which implements a gain relationship between the detector signal 107 and the attenuator 108. For example, if the detector 106 fails to provide the required signal voltages to properly drive the attenuator circuit, the signal conditioner can adjust the gain of the signal or apply an impedance change to match input impedance of the attenuator circuit. If desired, the signal conditioner 212 can also implement additional low or high pass filtering, so that the dynamic characteristics of the signal entering the attenuator are suitable for limiting the average power of the amplifier 110 to a pre-selected or dynamically determined value to prevent damage, while permitting adequate passage of signal peaks.

In one embodiment, the attenuator 108 comprises a shunt-limiting device for electrically coupling the input signal 102 to ground 226. The shunt-limiting device can comprise a field effect transistor (FET) 214. In the illustrated embodiment, the FET 214 comprises a gate 216 in communication with the detector signal 107 (which, as described above, may be optionally processed by the signal conditioner 212). The FET 214 also comprises a source 218 in communication with the input signal 102 and a drain in communication with the ground 226. In one embodiment, the FET 214 is an enhanced FET, so that a zero voltage on the gate 216 is adequate to assure no shunting of the input signal 102 to ground. The enhancement FET is used as a voltage controlled shunt limiter with the gate voltage provided by an average power detector circuit. The result is a circuit whose attenuation depends on the average power input. Alternatively, other FET 214 types can be used, so long as they are appropriately biased (using, for example, the signal conditioner 212) to assure that the input signal 102 is shunted the proper amount at the proper times to effect the average power limiting function described.

Through the appropriate choice of components a limiter is realized that has a slow response time such that the peak powers of short duration pass without attenuation while the average power is limited such that the desired operating point is not exceeded. In this way the dynamic gain and phase response is not affected by the limiter therefore the intermodulation distortion is not increased however the static gain and phase response is modified by the limiter providing a protection means for the TWT 114. With this limiter employed an upper level is set on the average input drive to the TWT 114.

Figure 10:
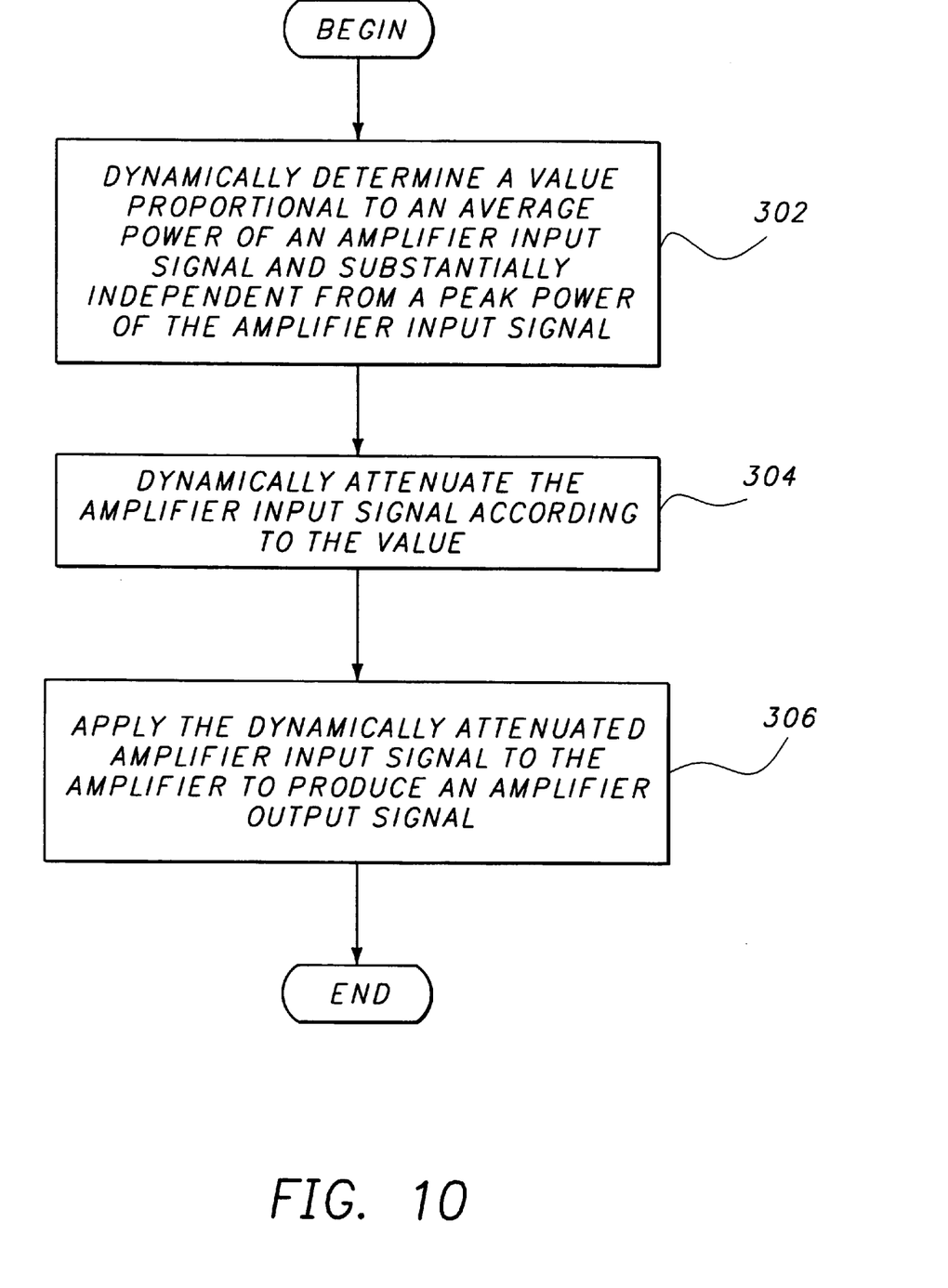
FIG. 10 is a flow chart illustrating representative process steps used in performing one embodiment of the present invention.

FIG. 10 is a flow chart depicting representative process steps used in performing one embodiment of the present invention. First, as shown in block 302, a value proportional to the average power of the input signal 102 and substantially independent from the peak power of the input signal 102 is determined. This determination is based on a measurement of a time-varying input signal 102, and is hence dynamic in nature. Importantly, the relationship between the input signal and the value described above need not be linearly proportional, as discussed earlier in this disclosure. Further, although the value is substantially independent from the peak power of the input signal 102, some residual relationship between the input signal 102 and the peak power is permitted. For example, in the embodiments described in the foregoing disclosure, the above operations were performed using a current rectifier 202 and a first order low pass filter 204, which substantially attenuates input signal 102 peaks, but does not entirely eliminate them. Accordingly, the present invention may be practiced with some residual manifestation of the short duration peaks included in the detector signal 107. Hence, value determined above need only be substantially independent from the peak power of the input signal 102 as is required to effect the purposes of the invention as disclosed herein, namely, limiting the average power output, while permitting generally linear passage of the input signal peaks.

Next, as shown in block 304, the input signal 102 is dynamically attenuated according to the value produced above. The dynamically attenuated input signal 102 is then applied to an amplifier 110.

Figure 11:
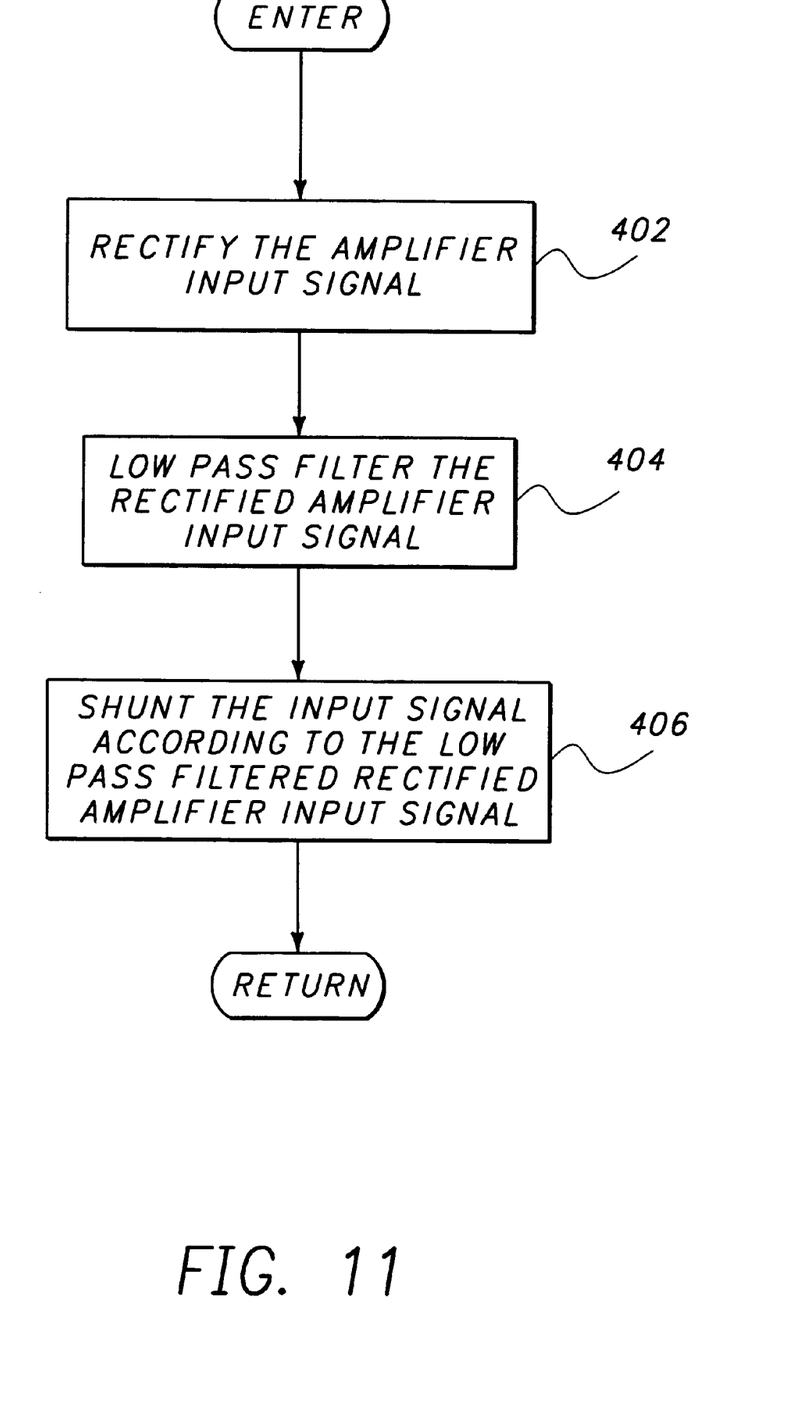
FIG. 11 is a flow chart illustrating representative process steps used in detecting the average power of the input signal and using the average power to limit the average power.

FIG. 11 is a flow chart depicting the above-described operations of dynamically determining the value and attenuating the input signal 102. As shown in blocks 402 and 404, the input signal is rectified, and low pass filtered to produce a detector signal 107. Then, the detector signal 107 is shunted according to the rectified and low pass filtered input signal.

Table I below presents the results of an initial analysis using computer modeled circuit similar to that which is disclosed in FIG. 9.

TABLE I

| Input | $V_{det}$ | $V_{gate}$ | Vs | $V_{load}$ | Atten |
|---|---|---|---|---|---|
| 2Asin(at)cos(bt) | 1.2 | −2 | 0.2V | 0.2 V | 0 |
| 2Asin(ωt) | 1.5 | +1 | 0.2V | <75 mV | 8.5dB |

The detector and attenuator circuits were modeled separately. The two cases modeled were (1) two-carrier composite signal that must pass with low loss and (2) a single carrier signal with the same peak amplitude that must be attenuated by at least 3 dB. As illustrated in Table I, the detector signal 107 voltage shows an increase of 0.3 volts or about 25% when the higher average power signal is present. This voltage alone is not sufficient to drive the FET 214 to the desired conduction level, so a signal conditioner 212 such as an amplifier was used to provide a three-volt level increase to drive the FET 214 gate 216. When the higher average power signal is present the FET 214 is driven into conduction and an attenuation of 8.5 dB is provided. Through adjustment of the signal conditioner 212 any desired attenuation characteristics could be provided.

CONCLUSION

This concludes the description of the preferred embodiments of the present invention. In summary, the present invention discloses a method and apparatus for limiting an average power output of an amplifier without limiting the peak power output of the amplifier.

The method comprises the steps of dynamically determining a value proportional to an average power of an amplifier input signal and substantially independent from a peak power of the amplifier input signal, dynamically attenuating the amplifier input signal according to the value, and applying the dynamically attenuated amplifier input signal to an amplifier to produce the amplifier output signal.

The apparatus comprises a detector for dynamically producing a detector signal proportional to an average power of the input signal and substantially independent from a peak power of the input signal, and an attenuator in communication with the detector and the amplifier, for dynamically attenuating the input signal according to the detector signal.

The present invention is particularly applicable to linearized space traveling wave tube systems. Many systems require that the amplifiers operate at an output back-off to obtain linearity, typical output back-off requirements can be 3 dB or more. Unfortunately, due to fault conditions there can be time when the amplifier is driven to its full saturated output power, therefore the amplifier must be capable of handling this power. The present invention eliminates this requirement, so that the amplifier needs only to handle the required operating power and not the higher fault conditions. This results in reduced complexity of the amplifier (which allows production of traveling wave tube systems at lower cost) and the ability to further optimize the amplifier at the operating point (which increases performance).

The foregoing description of the preferred embodiment of the invention has been presented for the purposes of illustration and description. It is not intended to be exhaustive or to limit the invention to the precise form disclosed. Many modifications and variations are possible in light of the above teaching. For example, since the relationship between the average power and the peak power is at least partially function of the number of carriers employed in the data signal, the foregoing invention may be practiced by determining the number of carriers used in the signal, and using this determination to set the time constant or other dynamic characteristics of the signal conditioner or the detector/signal conditioner combination. This can be implemented by employing a components with variable characteristics (such as capacitor 210 or resistor 208), by switching to one of several components with the proper characteristics. It is also envisioned that the signal conditioning provided by the present invention can be implemented by a computer or other processor, implementing instructions for performing digital filtering.

It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An traveling wave tube amplifier system, comprising:
    a traveling wave tube amplifier;
    a detector for dynamically producing a detector signal proportional to an average power of an input signal and substantially independent from a peak power of the input signal; and
    an attenuator in communication with the detector and said traveling wave tube amplifier, for dynamically attenuating the input signal according to the detector signal.

2. The device of claim 1, wherein said current rectifier further comprises a low pass filter series coupled to the cathode of said diode.

3. The device of claim 2, wherein the low pass filter produces a low pass filter output signal lagging a low pass filter input signal according to a first order time constant.

4. The device of claim 2, wherein the low pass filter produces a low pass filter output signal lagging a low pass filter input signal according to a multiple order time constant.

5. The device of claim 2, wherein the low pass filter comprises at least one resistive element coupled in parallel with at least one capacitive element.

6. The device of claim 5, wherein a resistance of the resistive element and the capacitance of the capacitive element are selected so as to substantially limit a detector response time to greater than 10 microseconds.

7. The device of claim 1, wherein the shunt limiter comprises a field effect transistor (FET) having a gate in communication with the detector signal and a source in communication with the ground.

8. The device of claim 1, wherein the FET is an enhancement FET.

9. The device of claim 1, wherein the shunt limiter is in communication with the detector signal via a signal conditioner, the signal conditioner implementing a gain relationship between the detector signal and the shunt limiter, wherein the gain relationship is selected to limit the average power output of the amplifier to a pre-selected value.

10. The device of claim 4 wherein the signal conditioner further implements an impedance relationship between the detector and the shunt limiter.

11. The device of claim 1, further comprising a predistortion linearizer coupled between the input signal and the detector for preconditioning the input signal.

12. A method of processing an input signal of a traveling wave tube amplifier, comprising the steps of:
    dynamically determining a value proportional to an average power of the input signal and substantially independent from a peak power of the input signal of a traveling wave tube amplifier;
    dynamically attenuating the input signal according to the value; and
    applying the dynamically attenuated input signal to a traveling wave tube amplifier to produce an output signal.

13. The method of claim 12, wherein the amplifier is a traveling wave tube amplifier.

14. The method of claim 13, wherein the step of determining a value proportional to the average power of the input signal and substantially independent from the peak power of the input signal comprises the steps of:
    rectifying the input signal; and
    low-pass filtering the rectified input signal.

15. The method of claim 14, wherein the step of rectifying the output signal comprises the step of passing the signal through a diode.

16. The method of claim 15, wherein the step of low pass filtering the rectified input signal comprises the step of passing the rectified amplifier signal through a low pass filter comprising a capacitive element coupled in parallel with a resistive element.

17. The method of claim 14, wherein the step of low pass filtering the rectified input signal comprises the step of producing a detector output signal lagging the input signal according to a first order time constant.

18. The method of claim 17, wherein the first order time constant is chosen to prevent damage to the amplifier.

19. The method of claim 18, wherein the first order time constant is between 10 microseconds and 1 millisecond.

20. The method of claim 14, wherein the step of low pass filtering the rectified input signal comprises the step of producing a detector output signal lagging the input signal according to a multiple order time constant.

21. The method of claim 12, wherein the step of shunting the input signal according to the rectified and low pass filtered input signal comprises the step of applying the rectified and low pass filtered input signal to a gate of a field effect transistor (FET).

22. The method of claim 14, further comprising the step of predistortion linearizing the input signal.

23. A signal embodied in a carrier wave in an output signal of a traveling wave tube amplifier, the signal produced by performing the method steps of:

dynamically determining a value proportional to an average power of an input signal of a traveling wave amplifier and substantially independent form a peak power of the input signal;

dynamically attenuating the input signal according to the value; and applying the dynamically attenuated input signal to a traveling wave tube amplifier to produce an output signal.

24. The signal of claim 23, wherein the amplifier is a traveling wave tube amplifier.

25. The signal of claim 24, wherein the method step of determining a value proportional to the average power of the input signal and substantially independent from the peak power of the input signal comprises the method steps of:

rectifying the input signal; and low-pass filtering the rectified input signal.

26. The signal of claim 25, wherein the method step of rectifying the amplifier output signal comprises the method step of passing the input signal through a diode.

27. The signal of claim 26, wherein the method step of low pass filtering the rectified amplifier signal comprises the method step of passing the rectified amplifier signal through a low pass filter comprising a capacitive element coupled in parallel with a resistive element.

28. The signal of claim 25, wherein the method step of low pass filtering the rectified input signal comprises the method step of producing a detector output signal lagging the input signal according to a first order time constant.

29. The signal of claim 25, wherein the first order time constant is chosen to prevent damage to the amplifier.

30. The signal of claim 29, wherein the first order time constant is between 10 microsecond and 1 millisecond.

31. The signal of claim 25, wherein the method step of low pass filtering the rectified input signal comprises the method step of producing a detector output signal lagging the input signal according to a multiple order time constant.

32. The signal of claim 23, wherein the method step of shunting the input signal according to the rectified and low pass filtered input signal comprises the method step of applying the rectified and low pass filtered input signal to a gate of a field effect transistor (FET).

33. The signal of claim 25, wherein the method steps further comprise the step of predistortion linearizing the input signal.

* * * * *

UNITED STATES PATENT AND TRADEMARK OFFICE
CERTIFICATE OF CORRECTION

PATENT NO. : 6,369,648 B1  Page 1 of 1
APPLICATION NO. : 09/295720
DATED : April 9, 2002
INVENTOR(S) : George F. Kirkman It is certified that error appears in the above-identified patent and that said Letters Patent is hereby corrected as shown below:

Column 9
Line 36, "An" should read --A--.
Line 64, after "signal" (second occurrence), the period (".") should read a semicolon (--;--); after the semicolon, insert --and--; after "and" insert
   --wherein the detector comprises a current rectifier, said current rectifier comprising a diode having an anode in communication with the input signal and wherein said attenuator comprises a shunt limiter for electrically coupling the input signal to ground according to the detector signal.--

Column 10
Line 44, after "signal", the period (".") should read a semicolon --;--; after the semicolon, insert --and--; after "and" insert
   --wherein the input signal is in communication with a diode anode and wherein the method step of dynamically attenuating the input signal according to the value comprises the method step of shunting the input signal to ground according to the rectified and low pass filtered input signal.--

Column 11
Line 25, after "signal" the period (".") should read a semicolon --;--; after the semicolon, insert --and--; after "and" insert
   --wherein the input signal is in communication with a diode anode and wherein the method step of dynamically attenuating the input signal according to the value comprises the method step of shunting the input signal to ground according to the rectified and low pass filtered input signal.--

Signed and Sealed this

Twenty-fourth Day of October, 2006

JON W. DUDAS
*Director of the United States Patent and Trademark Office*